United States Patent [19]

Nishimura

[11] Patent Number: 5,561,681
[45] Date of Patent: Oct. 1, 1996

[54] SEMICONDUCTOR LASER

[75] Inventor: Takashi Nishimura, Itami, Japan

[73] Assignee: Mitsubishi Denki Kabushiki Kaisha, Tokyo, Japan

[21] Appl. No.: 405,827

[22] Filed: Mar. 17, 1995

[30] Foreign Application Priority Data

Aug. 9, 1994 [JP] Japan .................................. 6-187284

[51] Int. Cl.⁶ ...................................................... H01S 3/19
[52] U.S. Cl. .................................................. 372/46; 372/45
[58] Field of Search ............................................ 372/46, 45

[56] References Cited

U.S. PATENT DOCUMENTS

| 4,660,208 | 4/1987 | Johnston, Jr. et al. | 372/46 |
|---|---|---|---|
| 5,045,496 | 9/1991 | Hess et al. | 437/81 |
| 5,170,404 | 12/1992 | Ohtoshi et al. | 372/46 |
| 5,452,315 | 9/1995 | Kimura et al. | 372/46 |

OTHER PUBLICATIONS

Ohkura et al, "Low Threshold FS–BH Laser on p–InP Substrate Grown By All–MOCVD", Electronics Letters, vol. 28, No. 19, Sep. 1992, pp. 1844–1845.

Sakakibara et al, "High–Power 1.3–μm InGaAsP P–Substrate Buried Crescent Lasers", Journal of Lightwave Technology, vol. LT–3, No. 5, Oct. 1985, pp. 978–984.

Kazmierski et al, "Universal Iron Behaviour In Zn–, Cd– and Be– Doped P–Type InP", Journal of Crystal Growth, vol. 116, 1992, pp. 75–80 (No month).

Primary Examiner—James W. Davie
Attorney, Agent, or Firm—Leydig, Voit & Mayer

[57] ABSTRACT

A semiconductor laser includes a first conductivity type lower cladding layer on a first conductivity type semiconductor substrate; an active layer for laser oscillation on the lower cladding layer; a second conductivity type first upper cladding layer on the active layer, the second conductivity type being opposite the first conductivity type; current blocking layers at both sides of the active layer to confine current flow to the active layer; a second conductivity type second upper cladding layer disposed on the first upper cladding layer and the current blocking layers, interfaces between the current blocking layers and (i) the lower cladding layer, (ii) the first upper cladding layer, and (iii) the second upper cladding layer being crystalline regrowth interfaces; and doped layers including at least one of Fe, Cr, and Co atoms as a dopant disposed at the crystalline regrowth interfaces. At least one of Fe, Cr, and Co enters into the crystal lattices and changes of the crystal lattices. Movements of impurities are suppressed at the crystalline regrowth interfaces, thereby suppressing laser deterioration.

17 Claims, 7 Drawing Sheets

Prior Art

SEMICONDUCTOR LASER

FIELD OF THE INVENTION

The present invention relates to a semiconductor laser and, more particularly, to enhancement of reliability of a semiconductor laser.

BACKGROUND OF THE INVENTION

Figure 6:
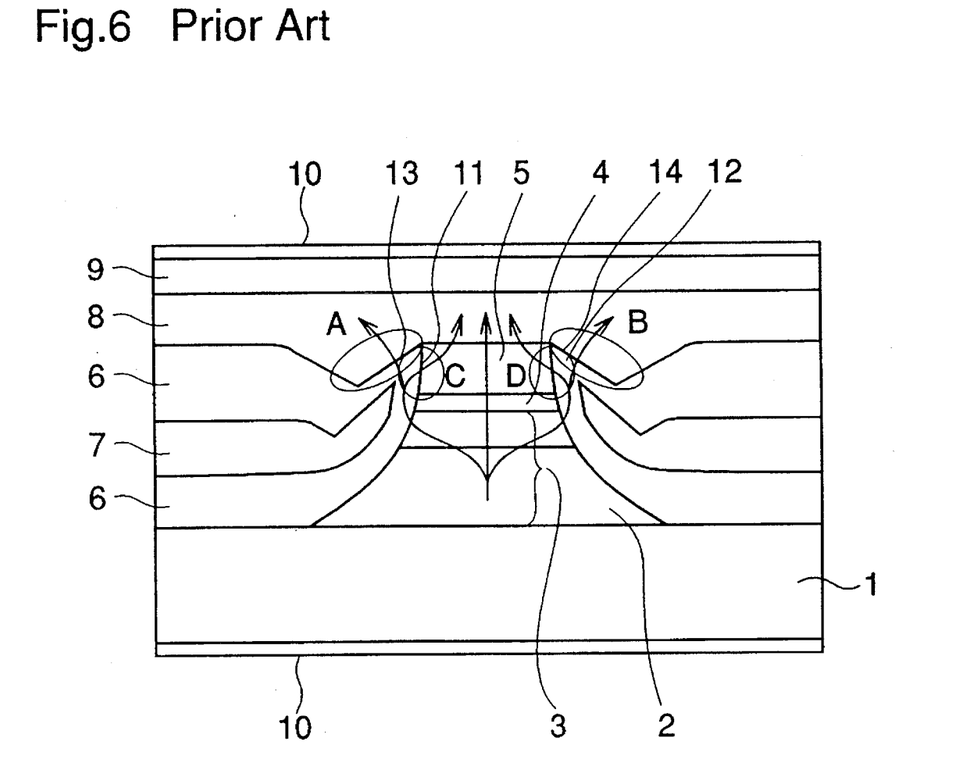
FIG. 6 is a cross-sectional view illustrating a structure of a prior art BH laser having a semiconductor substrate comprising p type InP.

FIG. 6 is a cross-sectional view illustrating a prior art buried heterostructure (BH) laser diode which is illustrated in, for example, SPIE-The International Society for Optical Engineering, Volume 2148, pages 142–151.

In the figure, reference numeral 1 designates a semiconductor substrate comprising p type InP. Reference numeral 3 designates a p type InP cladding layer including a buffer layer 2. An active layer 4 comprising InGaAsP is disposed on the p type InP cladding layer 3. A first n type cladding layer 5 comprising n type InP is disposed on the active layer 4. P type current blocking layers comprising p type InP are located on both sides of a mesa comprising the lower cladding layer 3, the active layer 4, and the upper cladding layer 5. An n type current blocking layer 7 comprises n type InP. A second n type cladding layer 8 comprising n type InP is in contact with the upper surface of the p type current blocking layer 6. A contact layer 9 comprising N type InP for making an ohmic contact is disposed on the second n type cladding layer 8. Reference numerals 11, 12, 13, and 14 designate crystalline regrowth interfaces, and reference numeral 10 designates an electrode comprising a metal.

In the figure, each arrow represents a current. The crystalline regrowth interfaces 11, 12, 13, and 14 that are formed during crystalline growth steps, regions A, B, C, and D, represented by circles, are regions that deteriorate during high temperature operation and through which leakage currents represented by arrows flow without flowing through the active layer 4. Deterioration is likely to occur at the pn junction interfaces between p type InP and n type InP, i.e., at the crystalline regrowth interfaces 11, 12, 13, and 14, during successive crystalline growth steps. Generally, the crystalline regrowth interfaces 11, 12, 13, and 14 are likely to be exposed to air or etched, resulting in the formation of natural oxide films or the presence of impurities, producing many crystalline defects.

Figure 7:
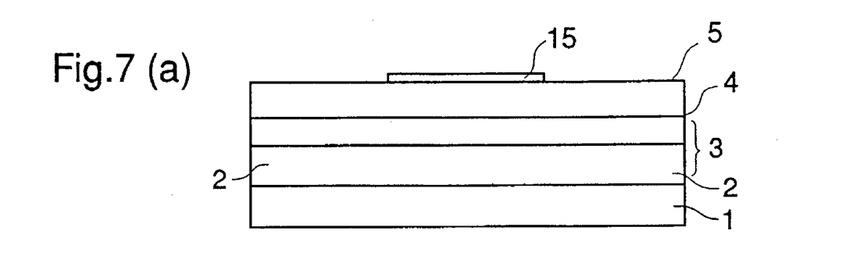
FIGS. 7(a)–7(d) are diagrams illustrating a method of fabricating a prior art BH laser having a semiconductor substrate comprising p type InP.

FIGS. 7(a)–7(d) are cross sectional views for explaining the process of fabricating the BH laser. As shown in FIG. 7(a), a p type cladding layer 3 comprising p type InP including a buffer layer 2, an active layer 4 comprising InGaAsP, and a first n type cladding layer 5 comprising n type InP are successively grown by MOCVD (metal organic chemical vapor deposition). Then a silicon dioxide film is grown, and the silicon dioxide film is patterned by photolithography to form a mask 15.

Subsequently, a shaped stripe mesa 16 is formed by etching, as shown in FIG. 7(b). The side wall of the stripe structure 16 is exposed to the etching material as well as to the air, whereby impurities and a natural oxide film are present at the side wall of the stripe structure 16.

Next, as shown in FIG. 7(c), a p type current blocking layer 6 comprising p type InP, an n type current blocking layer 7 comprising InP, and a p type current blocking layer 6 comprising p type InP are successively grown by MOCVD, thereby burying the active layer 4. Thereafter, the mask 15 is removed by etching. Then, on the surface of the p type current blocking layer 6 etching material remains as residual impurities along with a natural oxide film.

Subsequently, as shown in FIG. 7(d), a second n type cladding layer 8 comprising n type InP and a contact layer 9 comprising n type InP are grown by MOCVD and, thereafter, an electrode 10 is formed.

As is apparent from this fabricating process, there are two crystalline growth processes and there are impurities and natural oxide films at the regions A, B, C, and D in FIG. 6, i.e., at the pn junction interfaces of the crystalline regrowth interfaces 11, 12, 13, and 14 between the p type current blocking layer 6 and the first n type cladding layer 5, and between the p type current blocking layer 6 and the second n type cladding layer 8, whereby leakage currents that are ineffective in producing laser oscillation flow in the regions A, B, C, and D, thereby increasing operation current. This results in deterioration in the laser characteristics and deteriorated reliability.

Figure 8:
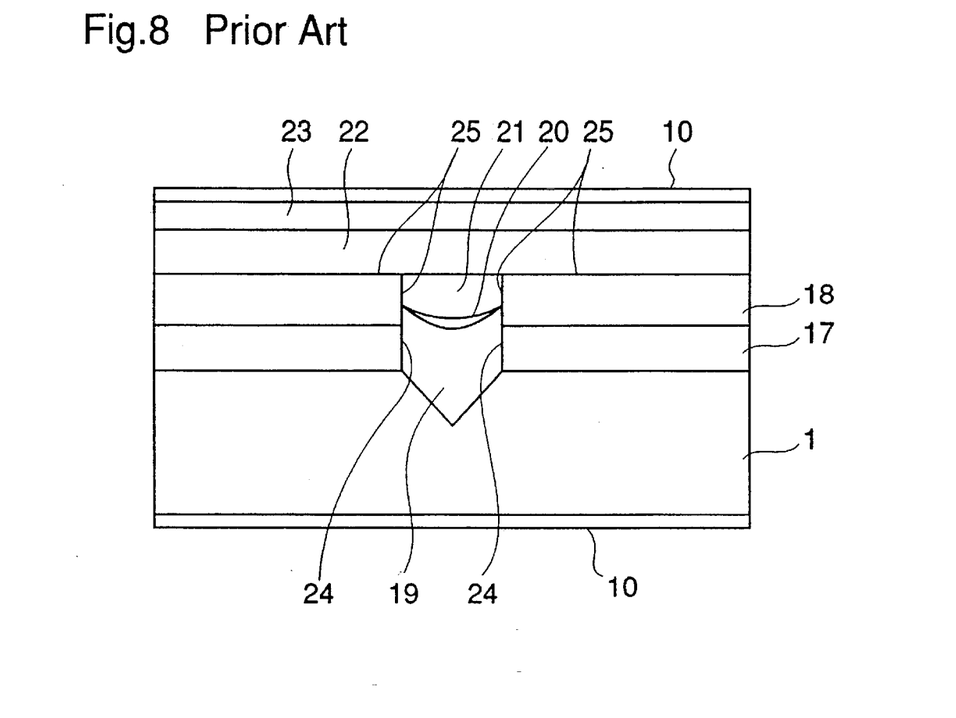
FIG. 8 is a cross-sectional view illustrating a structure of a prior art BH laser having a semiconductor substrate comprising p type InP.
Figure 9:
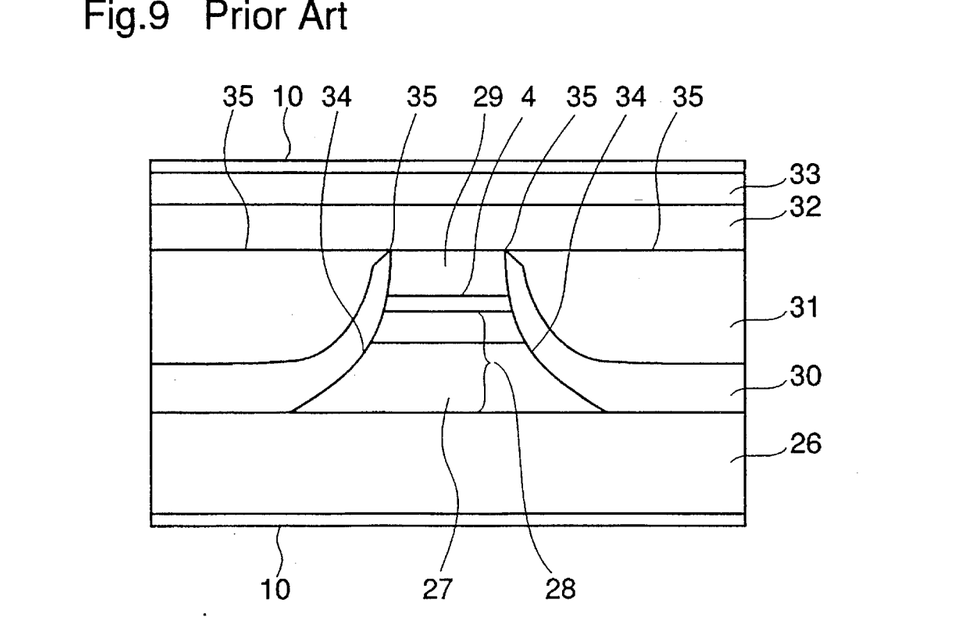
FIG. 9 is a cross-sectional view illustrating a structure of a prior art BH laser having a semiconductor substrate comprising n type InP.
Figure 10:
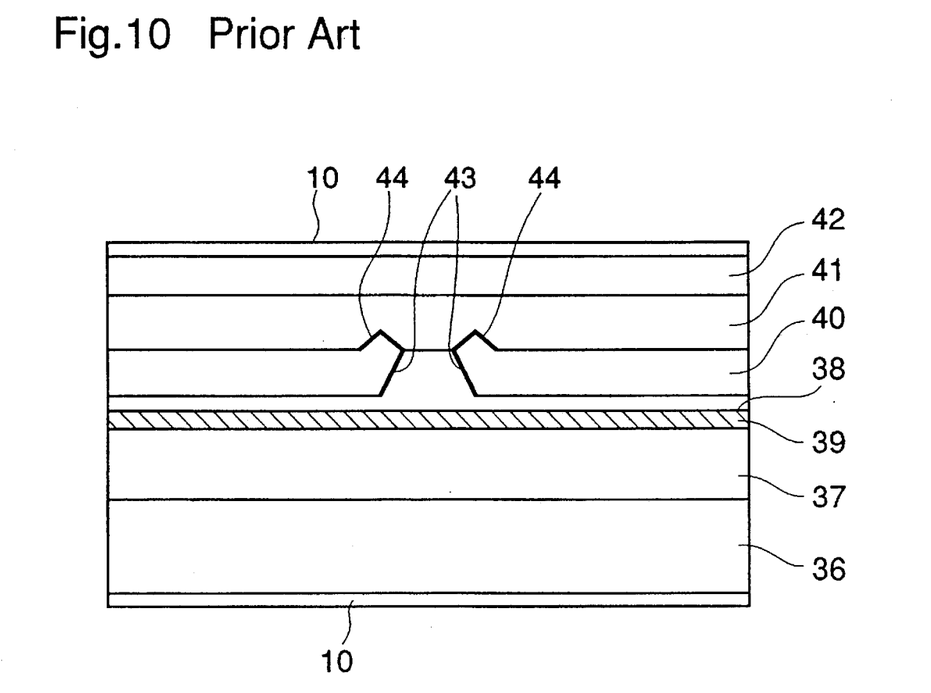
FIG. 10 is a cross-sectional view illustrating a structure of a prior art BR laser having a semiconductor substrate comprising n type GaAs.

While the foregoing description is concerned with a BH laser structure employing a semiconductor substrate comprising p type InP, in any of the BC (buried crescent) laser structure of FIG. 8 (described in Extended Abstracts of the 15th Conference on Solid State Devices and Materials, Tokyo, 1983, pp.337–340), the BH laser structure employing a semiconductor substrate comprising n type inP shown in FIG. 9, the BR (buried ridge)laser structure employing a semiconductor substrate comprising n type GaAs shown in FIG. 10, there arises laser deterioration at the regrown pn junction interfaces.

The BC laser structure shown in FIG. 8 includes a semiconductor substrate 1 comprising p type InP, an n type current blocking layer 18 comprising n type InP, a p type cladding layer 19 comprising p type InP, an active layer comprising InGaAsP, a first n type cladding layer 21 comprising n type InP, a second n type cladding layer 22 comprising n type InP, a contact layer 23 comprising n type InP, and an electrode 10. This BC laser is fabricated by successively growing on a p type InP semiconductor substrate 1 an n type current blocking layer 17 and a p type current blocking layer 18, successively, forming a stripe shaped groove on the p type current blocking layer 18 having a depth reaching the p type InP semiconductor substrate 1 from the surface of the p type current blocking layer 18, removing the mask, forming a p type InP cladding layer 19, an InGaAsP active layer 20, a first n type cladding layer 21 by liquid phase epitaxy so as to fill the groove, and successively forming a second n type cladding layer 22 and an n type InP contact layer 23, and an electrode 10. During these processes, there are formed the crystalline regrowth interface 24 between the n type current blocking layer 17 and the p type cladding layer 19, and the crystalline regrowth interface 25 between the p type current blocking layer 18 and the first n type cladding layer 21 and second n type cladding layer 22, at which the laser deteriorations would occur.

The BH laser structure shown in FIG. 9 includes an n type InP semiconductor substrate 26, an n type cladding layer 28 comprising n type InP including a buffer layer 27, an active layer 4 comprising InGaAsP, a first p type cladding layer 29 comprising p type InP, a p type current blocking layer 30 comprising p type InP, an n type current blocking layer 31 comprising n type InP, and a second p type cladding layer 32 comprising p type InP and a contact layer 33 comprising p type Inp. This BH laser is fabricated by growing on an n type InP semiconductor substrate 26 an n type cladding layer 28 including an n type InP buffer layer 27, an InGaAsP active layer 4, a first p type InP cladding layer 29 successively by MOCVD, then forming a mesa shaped stripe structure by etching from the surface of p type InP cladding layer 29 to reach the semiconductor substrate 26, employing a stripe shaped insulating film mask (not shown), regrowing the p type InP current blocking layer 30 and the n type InP current blocking layer 31 by MOCVD so as to bury the mesa shaped stripe, employing the mask as a selective growth mask, then removing the mask, and regrowing the second p type InP cladding layer 32 and p type InP contact layer 33. During these processes, laser deterioration occurs at the pn junctions at the crystalline regrowth interface 34 between the n type cladding layer 28 and the p type current blocking layer 30 and at the crystalline regrowth interface 35 between the n type current blocking layer 31 and the p type cladding layer 29 and second p type cladding layer 32.

In addition, the BR laser structure shown in FIG. 10 includes a semiconductor substrate 36 comprising n type GaAs, an n type cladding layer 37 comprising n type AlGaInP, a first p type cladding layer 38 comprising p type GaAs, an active layer 39 comprising GaAsP, an n type current blocking layer 40 comprising n type GaAs, a second p type cladding layer 41 and a contact layer 42 both comprising p type GaAs, and an electrode 10. This BR laser is fabricated by successively growing on an n type GaAs semiconductor substrate 36 an n type AlGaInP cladding layer 37, a GaAsP active layer 39, and a first p type GaAs cladding layer 38 by MOCVD, forming a stripe shaped mask (not shown) comprising an insulating film, etching to the first p type GaAs cladding layer 38 to a depth not reaching the GaAsP active layer 39 thereby to form a ridge, regrowing the n type GaAs current blocking layer 40 by MOCVD to bury the ridge employing the mask as a selective growth mask, and, after removing the mask, successively regrowing the second p type cladding layer 41 and contact layer 42, both comprising p type GaAs employing MOCVD. During this process, laser deterioration occurs at the regrown pn junction interface 43 between the first p type cladding layer 38 and the n type current blocking layer 40 and of the crystalline regrowth interface 44 between the second p type cladding layer 41 and the n type current blocking layer 40.

As discussed above, in the prior art BH, BC, and BR lasers, there are impurities and natural oxides films at regrown pn junction interfaces. Accordingly, as the operation current increases, the idle current increases. With this idle current flowing in a high temperature condition, the deterioration of regrown pn junction interfaces is accelerated, thereby causing a change in the operation current, resulting in laser deterioration, which in turn results in deteriorated reliability.

SUMMARY OF THE INVENTION

It is an object of the present invention to provide a semiconductor laser that solves the problem described above and that has a high reliability.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to the present invention, a semiconductor laser includes a first conductivity type cladding layer on a first conductivity type semiconductor substrate; an active layer for laser oscillation on the first conductivity type cladding layer; a first second conductivity type cladding on the active layer, the second conductivity type being opposite to the first conductivity type, current blocking layers at both sides of the active layer to converge current flow in the active layer; a second second conductivity type cladding layer in contact with the upper surface of the current blocking layer, wherein the interface between the first conductivity type cladding layer and first second conductivity type blocking layer and the current blocking layers and the interface between the second second conductivity type cladding layer and the current blocking layers are crystalline regrowth interfaces; and a doped layer including at least one of Fe, Cr, and Co atoms at the crystalline regrowth interface. At least one of Fe, Cr, and Co enters the crystaline lattices so the movement of impurities at the crystalline regrowth interfaces is suppressed, thereby suppressing laser deterioration.

DETAILED DESCRIPTION OF THE PREFERRED EMBODIMENTS

Embodiments 1 and 2

Figure 1:
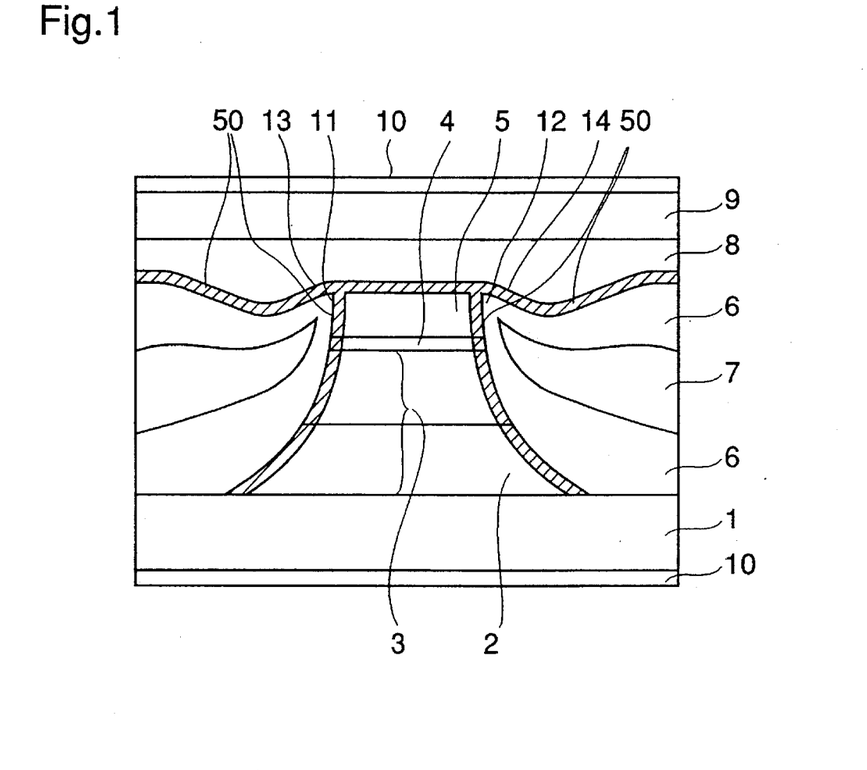
FIG. 1 is a cross-sectional view illustrating a semiconductor laser according to a first embodiment of the present invention.

FIG. 1 is a cross-sectional view illustrating a semiconductor laser according to a first embodiment of the present invention. In the figure, reference numerals 1–14 designate the same elements as in FIG. 6 which shows a BH laser employing a semiconductor substrate comprising p type InP.

The structure of FIG. 1 includes a layer 50 containing Fe in the vicinity of the regrown pn junction interfaces 11 and 12 between the first n type cladding layer 5 and the p type current blocking layer 6 and at the crystalline regrowth interfaces 13 and 14 between the second n type cladding layer 8 and the p type current blocking layer 6.

The semiconductor laser of this first embodiment is formed using a method similar to that for the prior art semiconductor laser shown in FIG. 6. The doped layer 50 is formed by including a source of Fe during the MOCVD step immediately before growing the p type current blocking layer 6 and the n type current blocking layer 7, after growing the p type current blocking layer 6 and the n type current blocking layer 7, and immediately before growing the second n type cladding layer 8. As the Fe dopant concentration, $1 \times 10^{16}$–$1 \times 10^{17}$ cm$^{-3}$ is preferable.

Figure 5:
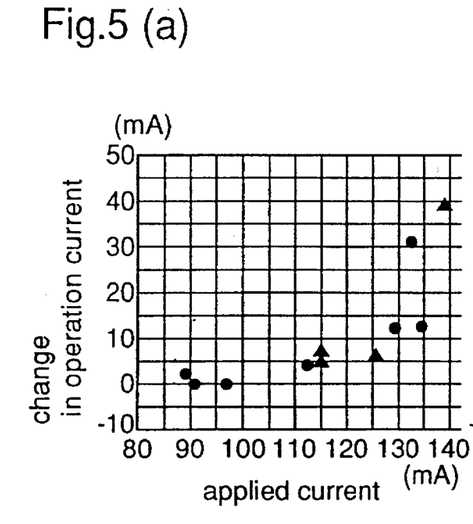
FIGS. 5(a) and 5(b) are diagrams showing the results of measurements of the change in operational current at an output of 5 mW after operation for 3000 hours of the prior art device and a device according to the present invention, respectively.

FIGS. 5(a) and 5(b) respectively show changes in the operational current relative to the initial operation current for lasers according to the prior art and the present invention operated at a temperature of 50° C. and at a constant current for 3000 hours. Thereafter, the lasers were operated at 5 mW output, with applied current as a parameter.

As is apparent from the figures, there is a tendency for the current to increase when the operational current is high in the prior art structure of FIG. 5(a), while in the structure of FIG. 5(b), having the doped layer 50 including Fe, the operational current does not change even with a high operational current, whereby a high reliability is obtained.

The deterioration of the pn junction interface is considered to be caused by a change of crystalline arrangement at the regrowth interfaces and movement (diffusion) of impurity atoms therein. The change of crystalline arrangement and the movement of impurity atoms are promoted because atoms move between crystalline lattices. Generally, because Fe atoms enter into a crystalline lattice of InP without occupying In or P lattice sites, they suppress changes in crystalline arrangement and the movements of impurity atoms. Therefore, in this embodiment, changes in crystalline lattices at the regrowth interfaces and the movement of impurities are suppressed by the Fe atoms, whereby the deterioration of the semiconductor laser can be suppressed.

Here, the doped layer 5 at the interface between the first n type cladding layer 5 and the second n type cladding layer 8 has a concentration of Fe atoms that is not high enough to make the doped layer 50 have a high resistance, i.e., a concentration of $1 \times 10^{16}$–$1 \times 10^{17}$ cm$^{-3}$, whereby there are no unfavorable influences on the laser characteristics.

Figure 2:
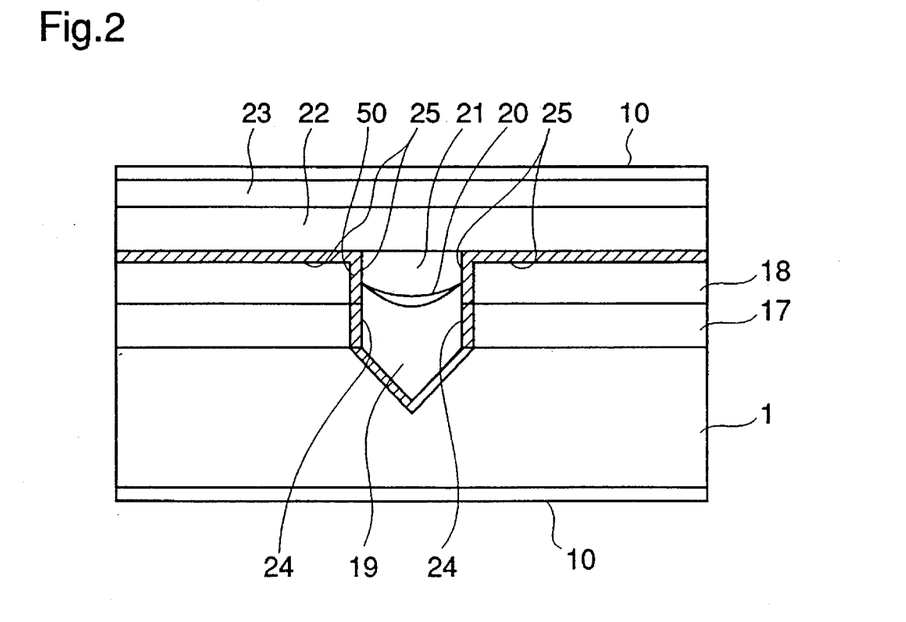
FIG. 2 is a cross-sectional view illustrating a semiconductor laser according to a second embodiment of the present invention.

The structure described above may be fabricated using liquid phase epitaxy as in the prior art semiconductor laser shown in FIG. 8. During that epitaxy, by using a melt including Fe in contact with the crystalline regrowth interfaces 24 and 25 immediately before growing the p type cladding layer 19, an Fe-doped layer 50 is formed.

BC lasers having the conventional structure and this embodiment, respectively, were operated at a constant current at a temperature of 50° C. for 3000 hours and, thereafter, the change in the operational current at 5 mW output relative to the initial operational current was measured with the applied current as a parameter. The results show that when the operational current was high in the prior art structure, the current increases, while the operational current does not change even at a high applied current in a structure according to this embodiment. Thus, high reliability is obtained as in FIGS. 5(a) and 5(b).

While in the first and second embodiments, p type InP is used for the semiconductor substrate 1, an n type InP substrate may be employed.

Embodiment 3

Figure 3:
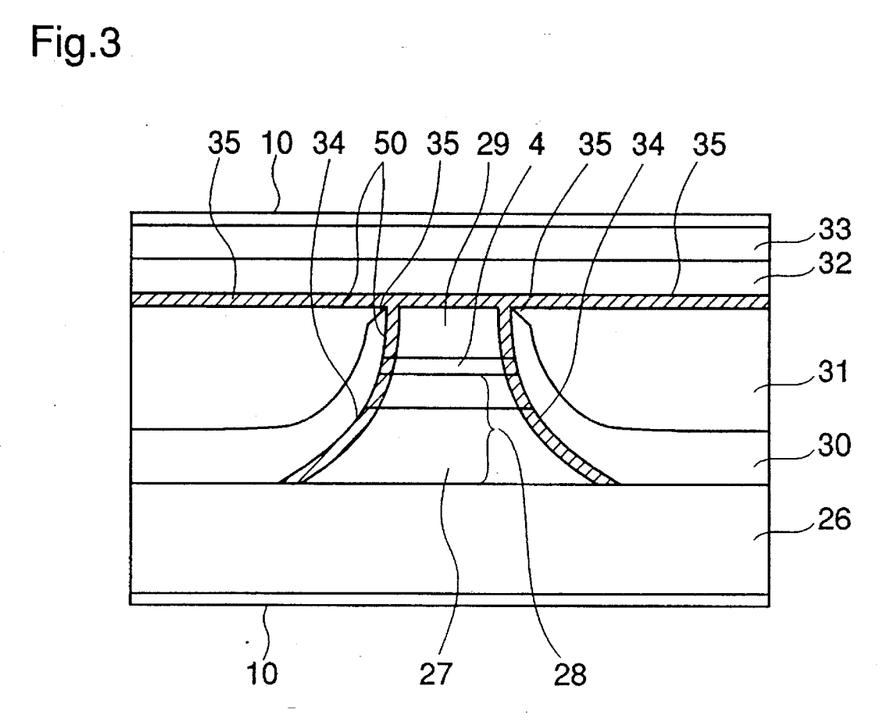
FIG. 3 is a cross-sectional view illustrating a semiconductor laser according to a third embodiment of the present invention.

FIG. 3 is a cross-sectional view illustrating a semiconductor laser according to a third embodiment of the present invention. In the figure, reference numerals 10 and 26–35 designate the same elements as in the prior art BH laser shown in FIG. 9 that employs an n type InP semiconductor substrate.

This semiconductor laser has doped layers 50 containing Fe atoms deposited during MOCVD growth at the regrown pn junction interface 34 between the n type cladding layer 28 and the p type current blocking layer 30 and the crystalline regrowth interface 35 between the first p type cladding layer 29, the second p type cladding layer 32, and the n type current blocking layer 31. This laser is fabricated by the same method as that for the prior art BH laser shown in FIG. 9. An Fe concentration of $1 \times 10^{16}$–$1 \times 10^{17}$ cm$^{-3}$ is preferable.

The BH lasers having the structures of this third embodiment and the prior art were operated at 50° C. and a constant current for 3000 hours and, thereafter, the change in the operational current at 5 mW output was compared to the initial operation current with the applied current as a parameter. Although there is a tendency in the prior art structure that the operational current increases when the operational current is high, as in the FIGS. 5(a) and 5(b), the operational current does not change even at a high current in a structure according to this third embodiment having the doped layer 50 containing Fe, thereby achieving high reliability.

While in the third embodiment n type InP is used for the semiconductor substrate 26, p type InP may be employed therefor.

Embodiment 4

Figure 4:
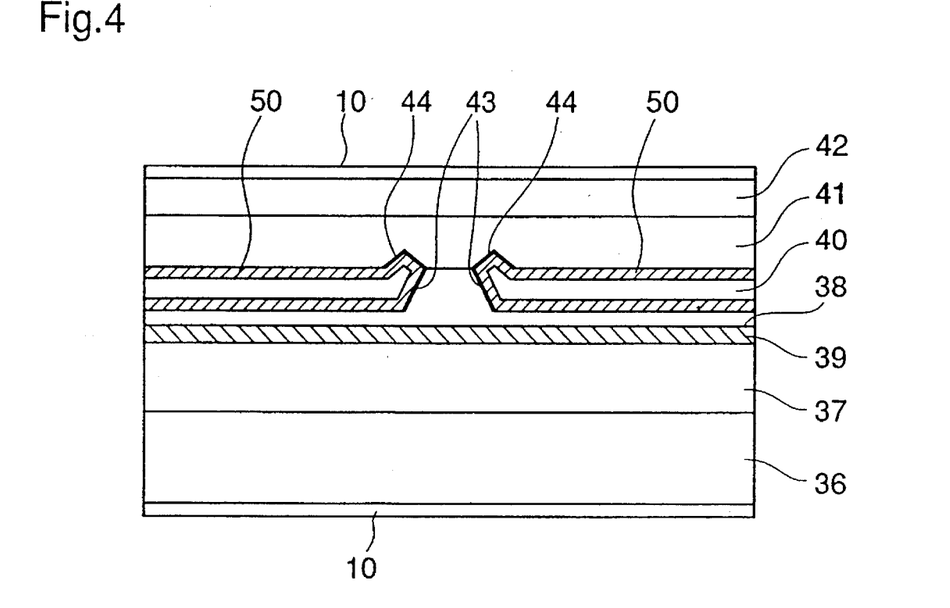
FIG. 4 is a cross-sectional view illustrating a semiconductor laser according to a fourth embodiment of the present invention.

FIG. 4 is a cross-sectional view illustrating a semiconductor laser according to a fourth embodiment of the present invention. In the figure reference numerals 10, 36–44 designate the same elements as those in the prior art BH laser shown in FIG. 10 that employs an n type GaAs semiconductor substrate.

As shown in the FIG., the laser structure according to this fourth embodiment includes doped layers 50 containing Fe incorporated during MOCVD growth at the regrown pn junction interfaces of the layer 43 and the first p type cladding layer 38 and the n type current blocking layer 40, and the layer 44 and the second p type cladding layer 41 and the n type current blocking layer 40. This semiconductor laser is fabricated by a method similar to that for the prior art semiconductor laser shown in FIG. 10, and in which a doped layer 50 is formed at the crystalline regrowth interface, containing Fe atoms, immediately before the growth of the n type current blocking layer 40 and the second p type cladding layer 41. As dopant concentration Fe atoms, $1 \times 10^{16}$–$1 \times 10^{17}$ cm$^{-}$ is preferable.

The BR lasers of this embodiment and the prior art structures were respectively operated at 50° C. and a constant current for 3000 hours and, thereafter, the change in the operational current at an output of 5 mW relative to the initial operational current was measured with the applied current as a parameter. Similar to FIGS. 5(a) and 5(b), although there is a tendency that current increases when the operational current is high in the prior art structure, the operational current does not change in a structure according to this fifth embodiment provided with the doped layer 50 including Fe, whereby high reliability is obtained.

While in the fourth embodiment GaAs is used as the semiconductor substrate, InP may be employed as the substrate.

While in the first to fourth embodiments, the doped layer 50 contains Fe, the doped layer 50 may include Cr or Co. In addition, the doped layer 50 may be doped with more than two dopants, e.g., Fe, Cr, and Co, with the same effects as in the first to fourth embodiments While a BH laser, a BC laser, and a BR laser are described, the present invention may be applied to semiconductor lasers which are fabricated employing other crystalline regrowth processes with the same effects.

What is claimed is:

1. A semiconductor laser comprising:

a first conductivity type semiconductor substrate;

a first conductivity type lower cladding layer disposed on said substrate;

an active layer for laser oscillation disposed on said first conductivity type lower cladding layer;

a second conductivity type first upper cladding layer disposed on said active layer, the second conductivity type being opposite to the first conductivity type;

current blocking layers disposed at opposite sides of said active layer for confining current flow to said active layer;

a second conductivity type second upper cladding layer in contact with an upper surface of said current blocking layers wherein interfaces between said current blocking layers and (i) said lower cladding layer, (ii) said first upper cladding layer, and (iii) said second upper cladding layer are regrowth interfaces; and doped layers including at least one of Fe, Cr, and Co atoms as a dopant disposed at said regrowth interfaces.

2. The semiconductor laser of claim 1, wherein said semiconductor substrate comprises InP.

3. The semiconductor laser of claim 1, wherein said lower cladding layer, said active layer, and said first upper cladding layer have a mesa shape and said current blocking layers bury said mesa shape.

4. The semiconductor laser of claim 3, wherein said semiconductor substrate comprises InP.

5. The semiconductor laser of claim 1, wherein said semiconductor laser has a buried crescent laser structure and said lower cladding layer, said active layer, and said first upper cladding layer are disposed in a groove in said current blocking layers, the groove reaching said semiconductor substrate.

6. The semiconductor laser of claim 5, wherein said semiconductor substrate comprises InP.

7. A semiconductor laser comprising:

a first conductivity type semiconductor substrate;

a first conductivity type lower cladding layer disposed on said substrate;

an active layer for laser oscillation disposed on said first conductivity type lower cladding layer;

a second conductivity type first upper cladding layer disposed on said active layer, the second conductivity type being opposite to the first conductivity type;

current blocking layers disposed at opposite sides of said active layer for confining current flow to said active layer;

a second conductivity type second upper cladding layer in contact with an upper surface of said current blocking layers wherein interfaces between said current blocking layers and (i) said lower cladding layer and (ii) said second upper cladding layer are regrowth interfaces; and doped layers including at least one of Fe, Cr, and Co atoms as a dopant disposed at said regrowth interfaces.

8. The semiconductor laser of claim 7, wherein said semiconductor substrate is selected from the group consisting of GaAs and InP;

said first upper cladding layer is a ridge; and said current blocking layers bury said ridge.

9. A semiconductor laser comprising:

a first conductivity type semiconductor substrate;

a mesa-shaped stripe structure comprising a first conductivity type lower cladding layer disposed on said first conductivity type semiconductor substrate, an active layer for laser oscillation disposed on said lower cladding layer; and a second conductivity type first upper cladding layer disposed on said active layer;

current blocking layers burying both sides of the mesa-shaped stripe structure;

a second conductivity type second upper cladding layer disposed on upper surfaces of said current blocking layers and said first upper cladding layer; and doped layers including at least one of Fe, Cr, and Co atoms as a dopant disposed at interfaces of said current blocking layers and (i) said second upper cladding layer, (ii) said active layer, (iii) said first upper cladding layer, and (iv) said second upper cladding layer.

10. The semiconductor laser of claim 9, wherein said semiconductor substrate comprises InP.

11. The semiconductor laser of claim 10, wherein said doped layer contains Fe atoms in a concentration of $1 \times 10^{16} \sim 1 \times 10^{17}$ cm$^{-3}$.

12. A semiconductor laser comprising:

a first conductivity type semiconductor substrate;

current blocking layers disposed on said semiconductor substrate and having a stripe-shaped groove having a depth reaching said semiconductor substrate;

a first conductivity type lower cladding layer, an active layer, and a second conductivity type first upper cladding layer successively disposed in and filling the stripe-shaped groove in said current blocking layers, and a second conductivity type second upper cladding layer disposed on said first upper cladding layer and said current blocking layers wherein interfaces between said current blocking layers and (i) said lower cladding layer, (ii) said first upper cladding layer, and (iii) said second upper cladding layer are regrowth interfaces; and doped layers including at least one of Fe, Cr, and Co atoms as a dopant disposed at said regrowth interfaces.

13. The semiconductor laser of claim 12, wherein said semiconductor substrate comprises InP.

14. The semiconductor laser of claim 12, wherein said doped layer contains Fe atoms in a concentration of $1 \times 10^{16} \sim 1 \times 10^{17}$ cm$^{-3}$.

15. A semiconductor laser comprising:

a first conductivity type semiconductor substrate;

a first conductivity type lower cladding layer disposed on said substrate;

an active layer disposed on said lower cladding layer;

a second conductivity type first upper cladding layer disposed on said active layer and including a ridge;

current blocking layers burying both sides of said ridge;

a second conductivity type second upper cladding layer disposed on said current blocking layers and said first upper cladding layer; and doped layers including at least one of Fe, Cr, and Co atoms as a dopant disposed at an interface of said current blocking layers and said first upper cladding layer and an interface of said current blocking layers and said second upper cladding layer.

16. The semiconductor laser of claim 15, wherein said first conductivity type semiconductor substrate comprises one of GaAs and InP.

17. The semiconductor laser of claim 16, wherein said doped layer contains Fe atoms in a concentration of $1 \times 10^{16} \sim 1 \times 10^{17}$ cm$^{-3}$.

* * * * *